United States Patent
Ishii et al.

(10) Patent No.: US 6,953,908 B2
(45) Date of Patent: Oct. 11, 2005

(54) PLASMA PROCESSING APPARATUS

(75) Inventors: Nobuo Ishii, Kobe (JP); Yasuyoshi Yasaka, 5-107, Sudome, Kohata, Uji-shi, Kyoto (JP), 611-0002

(73) Assignees: Tokyo Electron Limited, Tokyo (JP); Yasuyoshi Yasaka, Uji (JP)

( * ) Notice: Subject to any disclaimer, the term of this patent is extended or adjusted under 35 U.S.C. 154(b) by 0 days.

(21) Appl. No.: 10/736,844

(22) Filed: Dec. 17, 2003

(65) Prior Publication Data

US 2004/0149741 A1 Aug. 5, 2004

(30) Foreign Application Priority Data

Dec. 17, 2002 (JP) ........................................ 2002-365420

(51) Int. Cl.[7] .............................................. B23K 10/00
(52) U.S. Cl. .................................................. 219/121.43
(58) Field of Search ......................... 219/121.43, 121.4, 219/121.41, 121.42; 118/723 MW; 156/345.36, 345.34, 345.41; 204/298.37, 298.38

(56) References Cited

U.S. PATENT DOCUMENTS

| | | | |
|---|---|---|---|
| 5,690,781 A | | 11/1997 | Yoshida et al. |
| 5,922,223 A | * | 7/1999 | Okumura et al. ...... 219/121.43 |
| 6,091,045 A | * | 7/2000 | Mabuchi et al. ....... 219/121.43 |
| 6,388,632 B1 | * | 5/2002 | Murakawa et al. . 118/723 MW |
| 6,432,255 B1 | * | 8/2002 | Sun et al. ........... 118/723 MW |
| 6,527,909 B2 | | 3/2003 | Ishii et al. |
| 6,753,496 B2 | * | 6/2004 | Tadera et al. .......... 219/121.43 |
| 6,764,606 B2 | * | 7/2004 | Yanase ................... 219/121.43 |
| 2002/0011215 A1 | * | 1/2002 | Tei et al. ............. 118/723 MW |
| 2002/0088542 A1 | * | 7/2002 | Nishikawa et al. .... 156/345.34 |
| 2004/0094094 A1 | * | 5/2004 | Ohmi et al. ........ 118/723 MW |

FOREIGN PATENT DOCUMENTS

| | | |
|---|---|---|
| JP | 6037046 | 2/1994 |
| JP | 6104210 | 4/1994 |
| JP | 9232099 | 9/1997 |
| JP | 10214823 | 8/1998 |
| JP | 2000030897 | 1/2000 |
| JP | 2001156004 | 6/2001 |
| JP | 2003038951 | 2/2003 |
| JP | 2003059919 | 2/2003 |
| JP | 2003142457 | 5/2003 |

* cited by examiner

*Primary Examiner*—Teresa J. Walberg
(74) *Attorney, Agent, or Firm*—Crowell & Moring LLP (57) ABSTRACT

A plasma processing apparatus, comprising: at least, a plasma processing chamber for processing therein an object to be processed; antenna means for guiding microwaves into the plasma processing chamber; and a dielectric member disposed between the antenna means and the plasma processing chamber; wherein a surface of the dielectric member facing the inside of the plasma processing chamber has a projecting shape.

8 Claims, 7 Drawing Sheets

Fig.11B [A-A SECTION]
CURVED SURFACE

Fig.11C [B-B SECTION]
CURVED SURFACE

Fig.11A

PLASMA PROCESSING APPARATUS

BACKGROUND OF THE INVENTION

1. Field of the Invention

The present invention relates to a plasma processing apparatus which is suitably usable when an object to be processed is subjected to various plasma treatments for the purpose of manufacturing an electronic device, etc.

2. Background Art

In general, a plasma processing apparatus according to the present invention is widely applicable to various kinds of plasma processing procedures, which include the production of materials for electronic device such as semiconductors or semiconductor devices, and liquid crystal devices. For the convenience of explanation, however, the background art relating to semiconductor devices will be described below.

In general, in the processes for manufacturing semiconductor devices, a base material or substrate (such as wafer) for semiconductor devices as an object to be processed is subjected to various kinds of treatments such as CVD (chemical vapor deposition), etching, and sputtering.

Hitherto, there have been many cases wherein plasma processing apparatuses are used for conducting such various kinds of treatments. This is because, when the plasma processing apparatus is used, the base material can be processed while maintaining the base material at a relatively low temperature.

For example, when microwaves are used for conducting plasma treatments, it is a common procedure that a dielectric material is disposed between an antenna for emitting microwave, and a plasma processing chamber wherein the object to be processed is to be plasma-treated, for the purpose of maintaining the sealing condition in the inside of the plasma processing chamber.

In a case where such plasma processing is conducted under a certain condition, there can be generated an electromagnetic field (or surface wave) which propagates along the interface (i.e., plasma boundary region) between the above-mentioned dielectric material and the plasma which has been generated on the basis of the microwave irradiation. According to the investigations and knowledge of the present inventors, for example, it has been found that, when the plasma density is increased to an extent that the sheath region becomes negligible, the surface wave is generated depending on the microwave frequency, the dielectric constant of the dielectric material, and the electron density of the plasma.

When such surface wave is generated, surface wave plasma (SWP) is also generated in the inside of the plasma processing chamber, and there occurs a problem that a mode peculiar to the wave motion is provided.

Therefore, in view of the uniformity in the plasma and in the process utilizing the plasma, it has been demanded to suppress the generation of such surface waves.

Hitherto, in order to suppress the generation of the surface wave plasma, there have been taken roughly two kinds of measures: (1) a measure wherein the propagation of surface wave is obstructed; and (2) the generation of the surface wave per se is inhibited.

For example, a plasma processing apparatus wherein a metal member is disposed in the plasma boundary region is known, as one of the measures for obstructing the propagation of the surface wave according to the above method (1).

However, when a metal member is disposed in the plasma boundary region, unnecessary dust, particles, etc., are produced in the plasma processing chamber due to the sputtering phenomenon in the site where the plasma comes into contact with the metal member, whereby the process performance of the plasma processing can be greatly deteriorated.

SUMMARY OF THE INVENTION

An object of the present invention is to provide a plasma processing apparatus which has solved the above-mentioned problem encountered in the prior art.

Another object of the present invention is to provide a plasma processing apparatus which not only can suppress the production of dust, particles, etc., but also can suppress the surface wave plasma which is harmful to the plasma processing procedure.

As a result of earnest study, the present inventors have found that the provision of a specific shape to a dielectric material to be disposed between antenna means for guiding microwave, and a plasma processing chamber is extremely effective for attaining the above-mentioned object.

The plasma processing apparatus according to the present invention is based on the above discovery, and the plasma processing apparatus comprises: at least, a plasma processing chamber for processing therein an object to be processed; antenna means for guiding microwaves into the plasma processing chamber; and a dielectric member disposed between the antenna means and the plasma processing chamber; wherein a surface of the dielectric member facing the inside of the plasma processing chamber has a projecting shape.

The further scope of applicability of the present invention will become apparent from the detailed description given hereinafter. However, it should be understood that the detailed description and specific examples, while indicating preferred embodiments of the invention, are given by way of illustration only, as various changes and modifications, within the spirit and scope of the invention, will become apparent to those skilled in the art from this detailed description.

DETAILED DESCRIPTION OF PREFERRED EMBODIMENTS

Hereinbelow, the present invention will be described in detail with reference to the accompanying drawings, as desired. In the following description, "%" and "part(s)" representing a quantitative proportion or ratio are those based on mass, unless otherwise noted specifically.

(Plasma Processing Apparatus)

The plasma processing apparatus according to the present invention basically comprises: at least, a plasma processing chamber for processing therein an object to be processed; antenna means for guiding microwave into the plasma processing chamber; and a dielectric member disposed between the antenna means and the plasma processing chamber. This plasma processing apparatus is characterized in that a projecting shape is provided in the above-mentioned dielectric member facing the inside of the plasma processing chamber.

(One Embodiment of Plasma Processing Apparatus)

Figure 1:
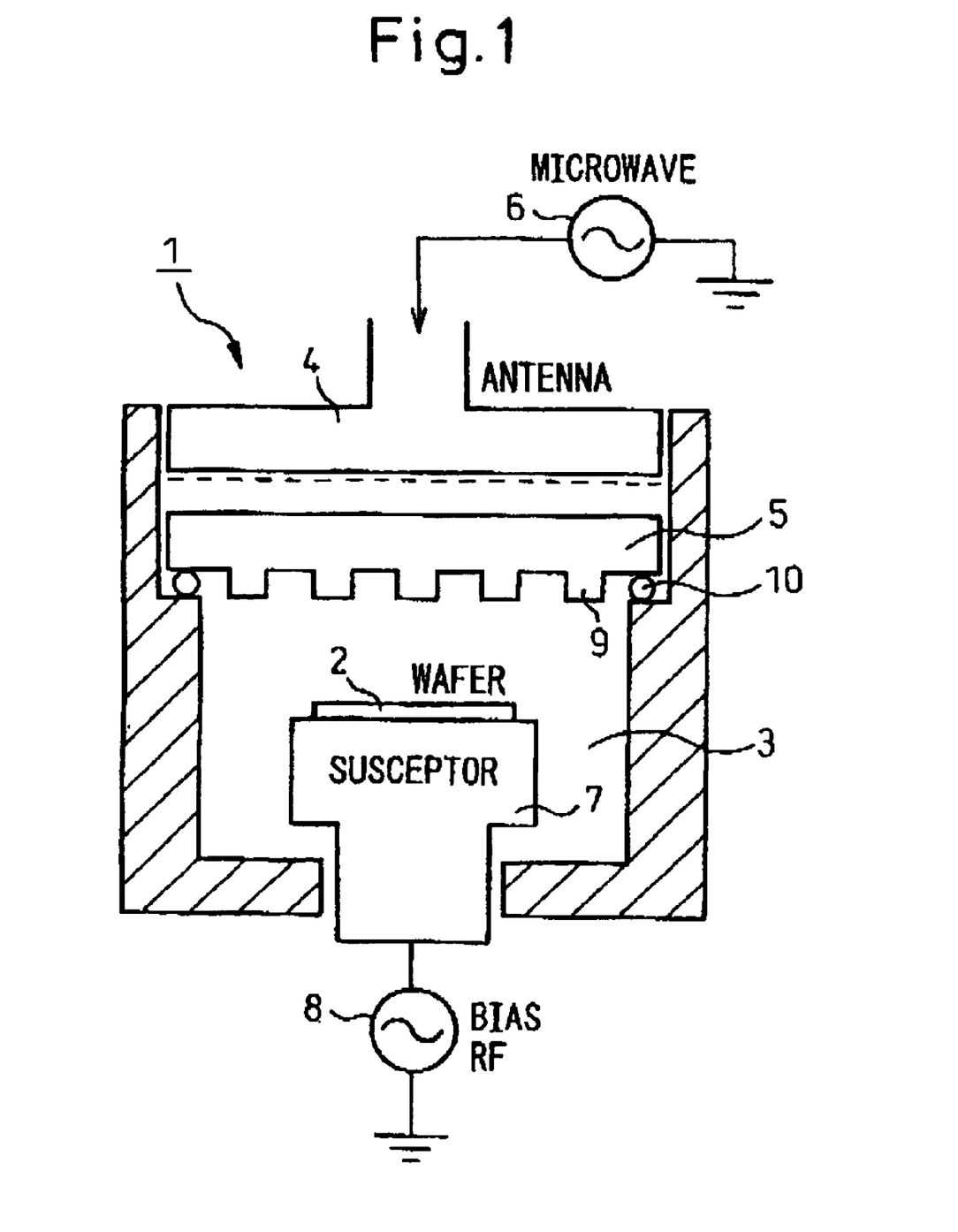
FIG. 1 is a schematic sectional view showing an embodiment of the plasma processing apparatus according to the present invention.
Figure 2:
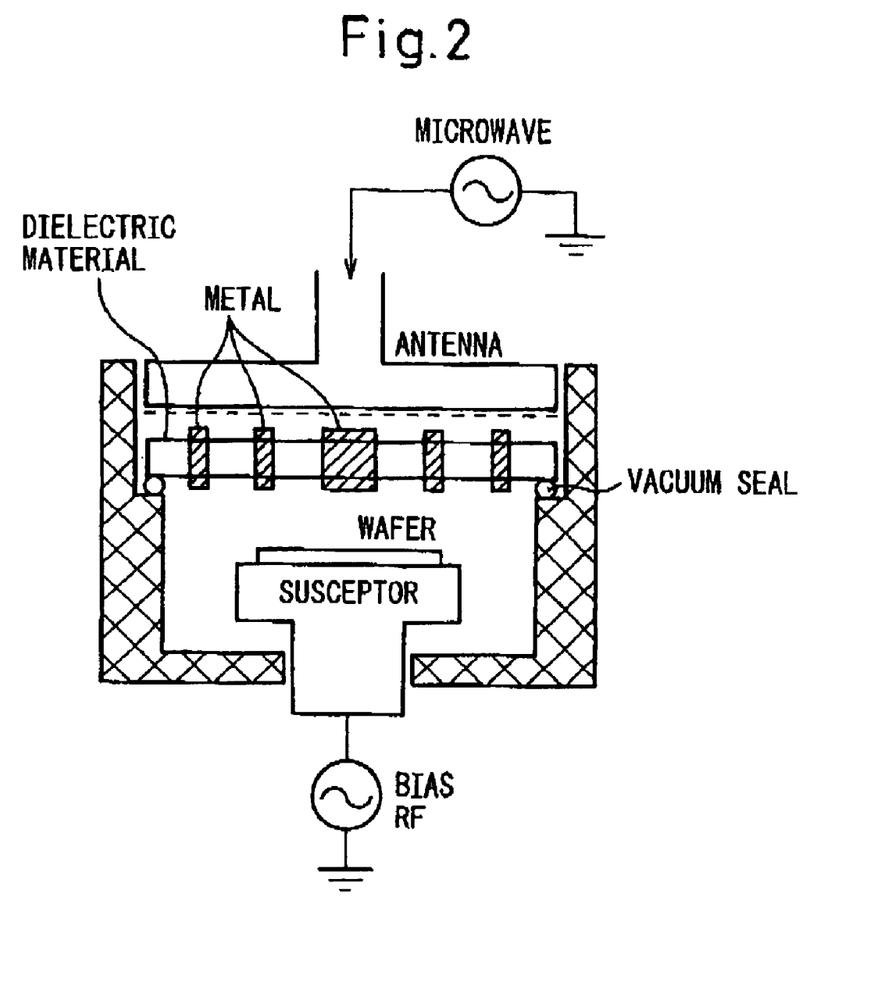
FIG. 2 is a schematic sectional view-showing an example of the plasma processing apparatus in the prior art wherein the propagation of surface waves is suppressed.

FIG. 1 is a schematic sectional view showing a preferred embodiment of the plasma processing apparatus according to the present invention. For the purpose of comparison, FIG. 2 shows a schematic sectional view of an example of the plasma processing apparatus in the prior art.

Referring to FIG. 1, the plasma processing apparatus according to this embodiment comprises: at least, a plasma processing chamber 3 for processing therein an object 2 (such as wafer) to be processed; antenna means 4 for guiding microwaves into the plasma processing chamber 3; and a dielectric member 5 disposed between the antenna means 4 and the plasma processing chamber 3. Between the dielectric member 5 and the wall of the plasma processing chamber 3, a vacuum seal 10 is disposed.

A microwave source 6 is connected to the above antenna means 4 so that microwaves may be supplied to the antenna means 4. On the other hand, a susceptor 7 on which the object 2 to be processed is to be disposed, is disposed in the plasma processing chamber 3, and the susceptor 7 is connected to a bias source 8 for applying a bias to the susceptor 7.

Further, in the present invention, at least one projecting shape 9 is provided on the surface of the above dielectric material 5. It is possible to effectively obstruct the propagation of surface wave which can propagate on, or in the neighborhood of, the surface side of the dielectric material 5, by providing such a projecting shape.

(Obstruction of Surface Wave Propagation in the Prior Art)

On the other hand, in a conventional apparatus using the surface wave propagation-obstructing means (including metal portion) as shown in FIG. 2, the purpose of obstructing the surface wave propagation can be attained in a certain extent. However, in a site or position at which the metal portion comes into contact with the plasma, the production of unnecessary dust and particles is more liable to occur, whereby the resultant processing performance for the object 2 to be processed (such as wafer) is deteriorated.

(Preferred Embodiment of Projecting Shape)

Figure 3:
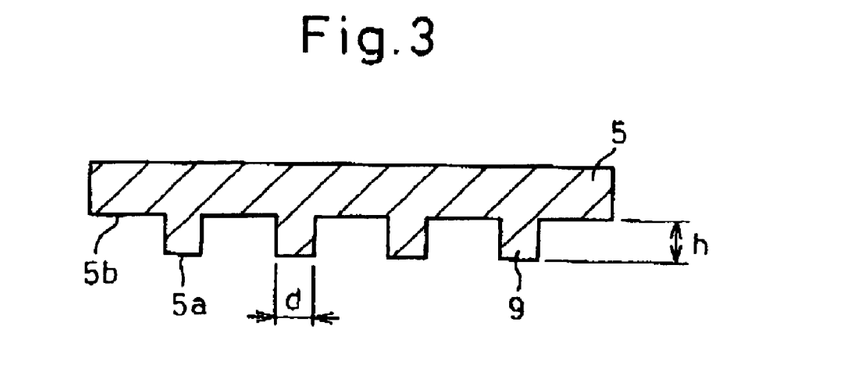
FIG. 3 is a schematic sectional view showing an example of the shape of a projecting shape (or protrusion) comprising a dielectric material in the plasma processing apparatus according to the present invention.

In the present invention, the shape, size of the projecting shape 9, the production process therefor, etc., are not particularly limited, as long as the suppression of the generation of the surface wave plasma, as the object of the present invention can be achieved. Referring to FIG. 3 which is a partial schematic sectional view of the projecting shape 9, in view of the effective suppression of a low-order mode, the height (maximum height) h of the projecting shape 9 may preferably be not smaller than the sheath width s of the plasma to be generated, and may more preferably be 1.5 times or more the sheath width s of the plasma. Herein, the "sheath width s" of the plasma is given by the following formula (Formula 1).

$$s = \frac{4}{3}\left(\frac{z \cdot \varepsilon_0^2}{e \cdot kTe}\right)^{\frac{1}{4}} \cdot \frac{v^{\frac{3}{4}}}{n_i^{\frac{1}{2}}} \qquad \text{[Formula 1]}$$

ρ : Sheath width in the case of direct-current sheath, $\varepsilon_o$ : Dielectric constant in vacuum, R: Boltzmann constant $T_e$ : Electron temperature V : Sheath potential, and $n_i$ : Ion density.

In general, in view of the suppression of the generation of the surface wave plasma, the height h of the above projecting shape 9 may preferably be 5 mm or more, more preferably than 8 mm or more. On the other hand, in view of the convenience at the time of designing the apparatus, the height h of the projecting shape 9 may preferably be 20 mm or less, more preferably 10 mm or less.

In addition, in view of the effective suppression of the generation of a low-order mode, the width d of the projecting shape 9 may preferably be about a half or more of the wavelength of the surface wave which is expected to be generated, and may preferably be about a half or less of the chamber diameter (L). More specifically, the width d of the projecting shape 9 may preferably be (¼)L or less, provided that the major axis length of the plasma processing chamber is represented by "L".

(Embodiment of Entire Projecting Shape)

With respect to the entirety of the projecting shape 9 provided in the dielectric material 5, the ratio of the total of the surface area 5a of portions having a projecting shape 9, and the total of the surface area 5b of portions having no projecting shape 9, i.e., the ratio of (the total of the surface area 5a)/(the total of the surface area 5b) may preferably be about 5–50, more preferably about 5–20. When the total surface area 5a is too large, there can be caused a problem such as the re-generation of the surface wave, and the residence or retention of gas.

(Reduction of Surface Wave)

In the present invention, the reduction of the surface wave in the case of the provision of the above-mentioned projecting shape of the dielectric material can be confirmed by the following measuring method. In the present invention, the degree of the reduction of the surface wave may preferably be ½ or more the original value thereof.

(Method of Confirming Reduction of Surface Wave)

The reduction of the surface wave can be confirmed by the fact that there is substantially no image corresponding to the wave motion in the resultant product of the processing.

(Method of Measuring Reduction of Surface Wave)

In the case of the off-process, the reduction of the surface wave can be measured by confirming whether the wave motion property is present in the distribution of the plasma density in the radial direction, by use of a probe method, etc. Alternatively, the reduction of the surface wave can be measured by observing images obtained by a CCD (charge-coupled device) camera.

(Provision of Curved Surface, etc., to Corner)

When the projecting shape 9, is provided in the dielectric material on the side thereof facing the plasma-generating space, it is possible that, in a process such as etching and CVD, a thin film which has been formed on a portion (such as corner or edge region) in the plasma processing chamber due to the reaction of a process gas, can be released from the portion, and can be attached to an object (such as wafer) to be processed, whereby the desired processing can be obstructed. In order to effectively avoid such a phenomenon, it is preferred to adopt the following measure (1) and/or (2). The formation of the above-mentioned projecting shape 9 has a main purpose of obstructing the propagation of the surface wave, but such provision of a curved surface can also contribute to the suppression of the surface wave generation.

(1) The surface of the dielectric material facing the plasma-generating space is a mirror-polished surface.

This is because the above thin film is more liable to be formed (therefore, the release of the thin film is more liable to occur), when the plasma-generating space side of the dielectric material has an uneven shape (i.e., a shape having a protrusion and an indentation).

(2) The projecting shape of the dielectric material is provided with a curved surface.

Figure 4A:
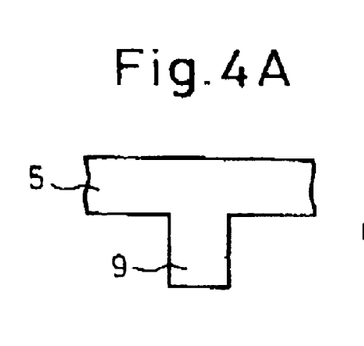
FIGS. 4A and 4B are schematic sectional views for illustrating an example of the embodiment of the plasma processing apparatus according to the present invention wherein the corner or edge region of a dielectric material projecting shape (FIG. 4A) is provided with a curved (or round) surface (FIG. 4B).
Figure 4B:
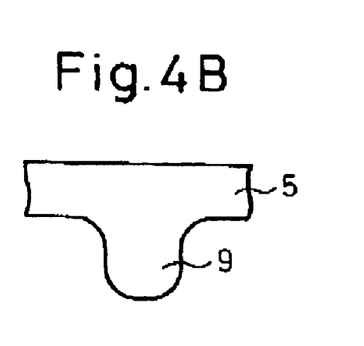

For example, with reference to a schematic sectional view of FIGS. 4A and 4B, the corner region of the projecting shape 9 of the dielectric material 5 may preferably be provided with a curved surface as completely as possible.

(Provision of Curved Surface to Inner Wall of Plasma Processing Chamber)

Figure 5:
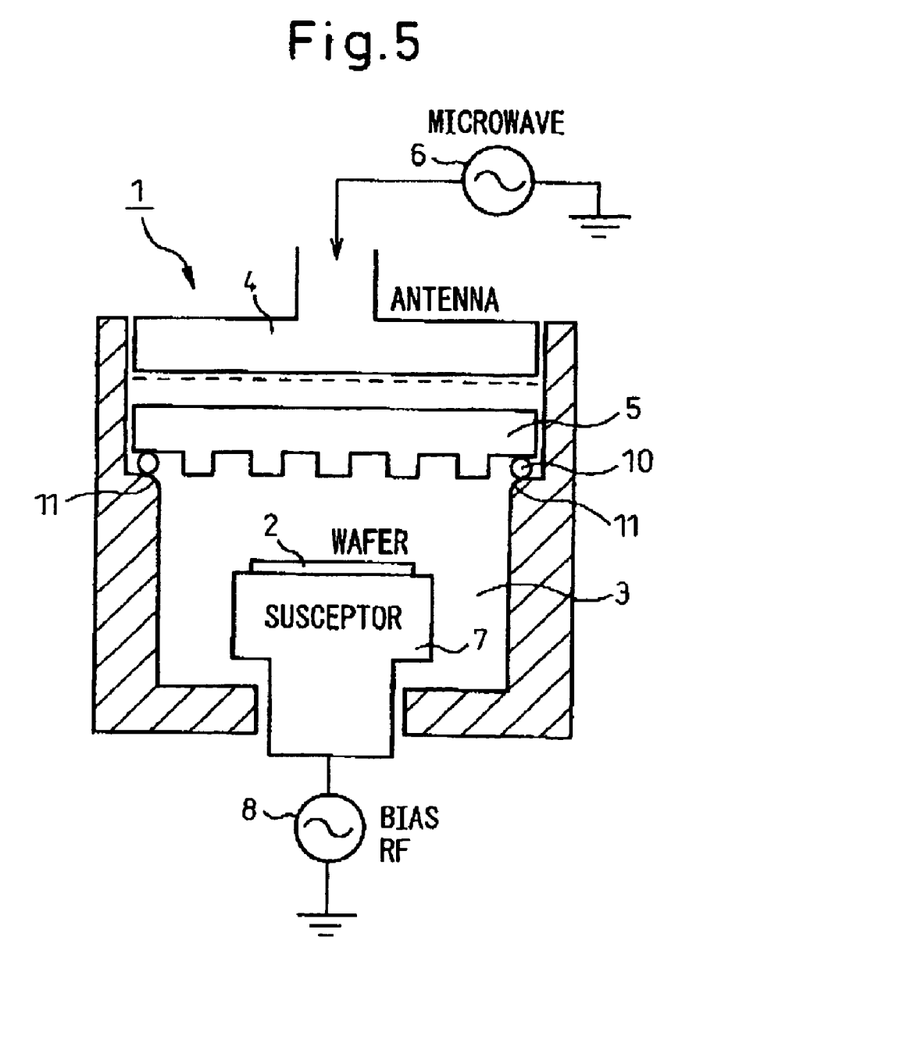
FIG. 5 is a schematic sectional view showing an example of the embodiment of the plasma processing apparatus according to the present invention wherein the wall of a plasma processing chamber in the neighborhood of a sealing member is provided with a curved surface.

In the present invention, as desired, it is preferred that, in the top surface portion of the chamber 3, a curved surface shape is provided to a corner region 11 of the contacting surface portion of the chamber wall with a vacuum seal 10 and an insulator 5 to be used for introducing an electromagnetic field, as shown in FIG. 5.

The surface wave is liable to be generated at a site or portion at which the impedance is markedly changed. Accordingly, the generation of the surface wave can be suppressed by relaxing or reducing the impedance change. The formation of the above-mentioned projecting shape 9 has a main purpose of obstructing the propagation of the surface wave, but such provision of a curved surface has a main purpose of suppressing the generation of the surface wave. Therefore, according to the constitution as shown in this FIG. 5, it is possible to suppress the surface wave plasma more effectively, by the synergistic effect of the propagation inhibition of the surface wave and the suppression of the surface wave generation.

The radius of curvature of the curved surface shape 11 may be as large as possible. More specifically, with respect to the wavelength $\lambda_g$ as shown by the following formula, the radius of curvature of the curved surface shape 11 may preferably be $(1/16)\lambda_g$ or more, particularly $(1/8)\lambda_g$ or more.

$$\lambda_g = \frac{\lambda}{\sqrt{\varepsilon_r}} \quad \text{[Formula 2]}$$

$\lambda$ : Wavelength of microwave in vacuum, $\varepsilon_r$ : Relative dielectric constant which is equivalent to the space formed by the antenna, the upper surface of the chamber wall, and the shielding side of the side wall.

(Constitution of Respective Portions)

The structure or constitution of the respective portions of the plasma processing apparatus as shown in FIGS. 1 and 5 will be described in detail.

(Object to be Processed)

The structure, material, shape or form, size of the object 2 to be processed, the production process therefor, etc., are not particularly limited, unless these factors are substantially contrary to the purpose of the present invention. In view of the usefulness of the plasma processing, the following materials (such as materials for electron devices) may preferably be used.

(1) Semiconductor Device Materials

For example, single crystal silicon, AsGa, SOI, SOS, etc.

(2) Liquid Crystal Device Materials

For example, glass base materials or substrates, etc.

(Plasma Processing Chamber)

The structure, material, shape or form, size of the wall constituting the plasma processing chamber 3, the production process therefor, etc., are not particularly limited, unless these factors are substantially contrary to the purpose of the present invention. In view of the production of particles, the following wall materials for the plasma processing chamber may preferably be used.

Pure Al, fluorinated Al, hard-Alumite treated Al.

Partially, ceramics such as quartz and alumina are usable.

(Antenna Means)

The structure, material, shape or form, size of the antenna means 4, the production process therefor, etc., are not particularly limited, unless these factors are substantially contrary to the purpose of the present invention. In view of the uniformity in the plasma and process, the following antenna means may preferably be used.

Plane (or flat-type) antenna (such as slot plane antenna), curved surface antenna, umbrella-shaped antenna (Dielectric Member)

The material, shape or form, size, of the dielectric member 5, the production process therefor, etc., are not particularly limited, unless these factors are substantially contrary to the purpose of the present invention. In view of the load-resisting workability and availability, the following materials may preferably be used.

Quartz glass, alumina ceramics, AlN ceramics (Projecting Shape)

The material of the projecting shape 9 may usually be the same as the material of the dielectric material 5.

(Plasma)

In the present invention, the following properties of the plasma, which are to be provided on the basis of the antenna means, are preferred.

Electron temperature; 1–2 eV

Density: $5E^{11}$ to $1E^{13}$

Uniformity in the plasma density: ±5% or less (Plane Antenna Member)

In the present invention, it is possible to generate plasma having a low electron temperature and a high density, by supplying microwaves through a plane antenna member having plural slots (sometimes referred to as "RLSA"; or Radial Line Slot Antenna). In the present invention, various kinds of processing can be conducted by using such a plasma having excellent properties, and therefore the present invention enables a process wherein the plasma damage is a low and the reactivity is high, even at a low temperature.

(Another Embodiment of Projecting Shape)

In the present invention, it is possible that the above projecting shape 9 is provided along the circumferential or radial direction, or is provided so as to provide a cross-type arrangement. The cross-type arrangement may be formed so that the respective elements of the projecting shape constituting the cross-type arrangement are disposed in the longitudinal direction, transverse direction, and/or radial direction.

(Projecting Shape in Circumferential Direction)

Figure 6A:
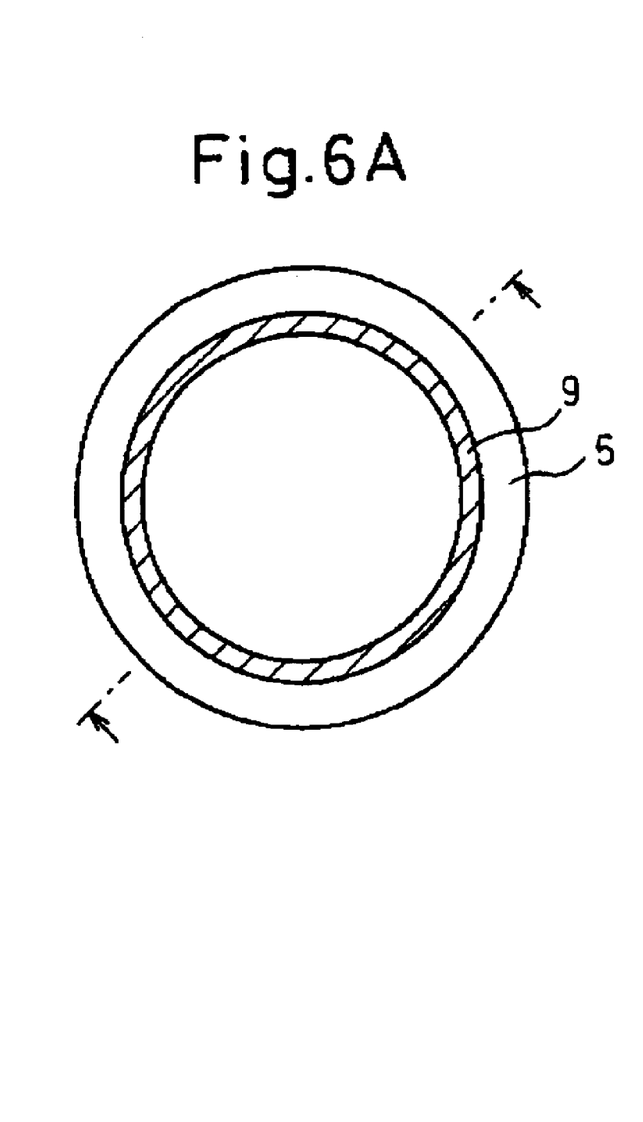
FIG. 6A is a schematic plan view showing an example of the embodiment of the plasma processing apparatus according to the present invention wherein a projecting shape is provided in the circumferential direction.
Figure 6B:
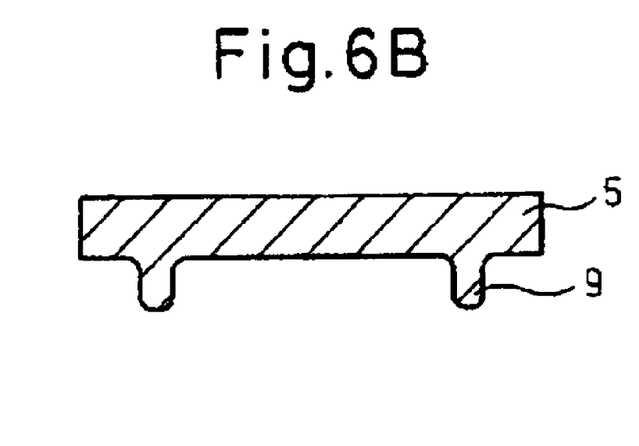
FIG. 6B is a schematic sectional view showing an example of the section of the projecting shape shown in FIG. 6A which has been provided with a curved surface.

FIG. 6A is a schematic plan view showing an example of the embodiment wherein a projecting shape 9 is provided along the circumferential direction. The FIGS. 6B and 6C are schematic sectional views each showing an example of the section of the projecting shape 9 of FIG. 6A.

Referring to FIG. 6A, in this embodiment, the projecting shape 9 is provided along the circumferential direction which is substantially concentric with the outer periphery of the dielectric material 5. In the embodiment of the projecting shape 9 as shown in FIG. 6B, the corner or edge region of the projecting shape 9 is provided with a curved, round or smoothed surface, i.e., a shape by which dust sources are less liable to be attached to the corner region even in a process using a gas having a film-forming property, etc. The radius of curvature R of the curved surface of this embodiment may preferably be 1 mm or more.

Figure 6C:
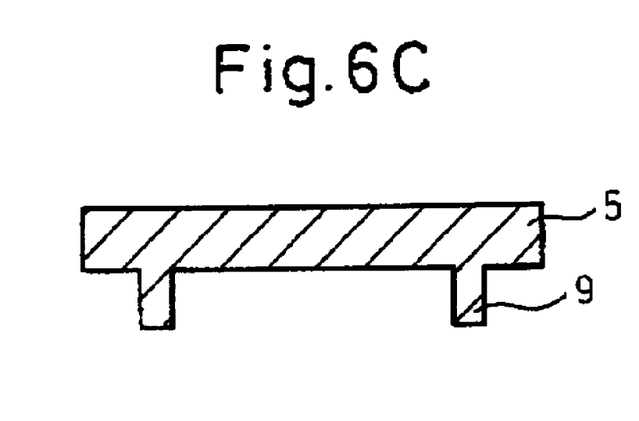
FIG. 6C is a schematic sectional view showing an example of the section of the projecting shape shown in FIG. 6A which has not been provided with a curved surface.

On the other hand, in the embodiment of the projecting shape 9 as shown in FIG. 6C, the corner region of the projecting shape 9 is not provided with a curved surface. In general, when a gas having a film-forming property, etc., is not used, such a corner having no curved surface is also usable.

(Cross-Type Shape)

Figure 7A:
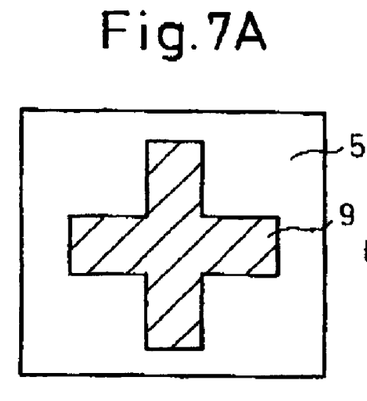
FIGS. 7A–7D are schematic plan views each showing an example of the embodiment of the plasma processing apparatus according to the present invention wherein projecting shapes are provided so as to form a cross-type arrangement.
Figure 7B:
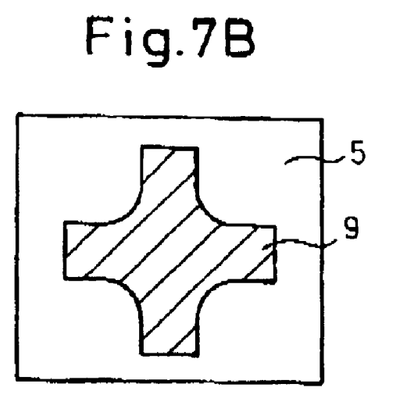

FIGS. 7A–7D are schematic plan views each showing an example of the embodiment wherein the projecting shape 9 on the dielectric material 5 has a cross (or crossing)—type shape. Referring to FIG. 7A, in this embodiment, the projecting shape 9 on the dielectric material 5 has a cross-type shape. In view of the prevention of the attachment of source, the cross portion may preferably be caused to have a curved surface as shown in FIG. 7B.

Figure 7C:
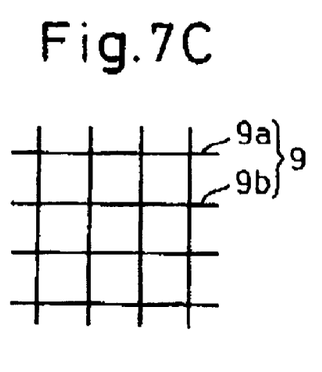
Figure 7D:
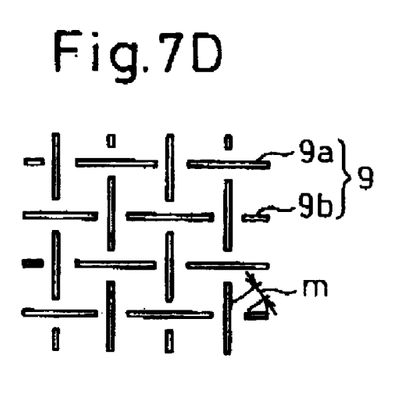

On the other hand, FIG. 7C shows an embodiment wherein the projecting shape 9 is constituted by a lattice-type form comprising projecting shapes 9a in the transverse direction, and projecting shapes 9b in the longitudinal direction. In view of the prevention of the attachment of dust sources, the cross portion may preferably have the shape of FIG. 7D wherein the formation of the crossings between the projecting shapes 9a and 9b is avoided. In the embodiment of this FIG. 7D, the width m of the gap between the projecting shapes 9a and 9b may preferably be 2 mm or more, more preferably 5 mm or more, in view of the prevention of the thin film formation (i.e., the prevention of the dust source formation) at this site. On the other hand, in view of the efficiency of the prevention of surface wave plasma generation, the width m of the gap may preferably be 15 mm or less, more preferably 10 mm or less.

(Cross-Type Shape in Radial Direction)

Figure 8A:
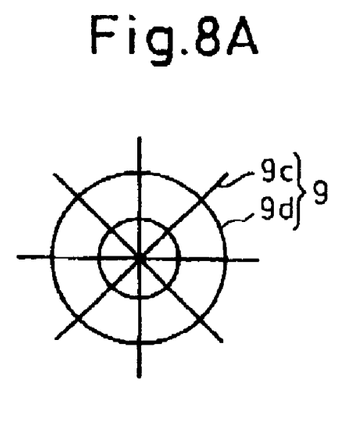
FIGS. 8A and 8B are schematic plan views each showing an example of the embodiment of the plasma processing apparatus according to the present invention wherein projecting shapes are provided in the radial and circumferential directions.
Figure 8B:
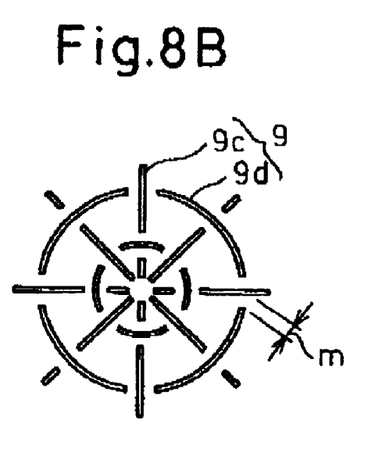

FIGS. 8A and 8B are schematic plan views each showing an example of the embodiment wherein the projecting shape 9 on the dielectric material 5 is caused to have a cross-type shape in the radial direction. Referring to FIG. 8A, in this embodiment, the projecting shape 9 on the dielectric material 5 is constituted by projecting shapes 9c in the transverse direction along the radial direction, and projecting shapes 9d in the circumferential direction. In the same manner as in the case of the above-mentioned embodiment of FIG. 7D, in view of the prevention of the attachment of dust sources, the cross portion may preferably have a shape of FIG. 8B wherein the formation of the cross portions between the projecting shapes 9c and 9d is avoided. In the embodiment of FIG. 8B, the width m of the gap between the projecting shapes 9c and 9d may preferably be 2 mm or more, more preferably 5 mm or more, in view of the prevention of the thin film formation (i.e., the prevention of the dust source formation) at this site. On the other hand, in view of the efficiency of the prevention of surface wave plasma generation, the width m of the gap may preferably be 15 mm or less, more preferably 10 mm or less.

(Example of Arrangement of Cross-Type Projecting Shape)

Figure 9:
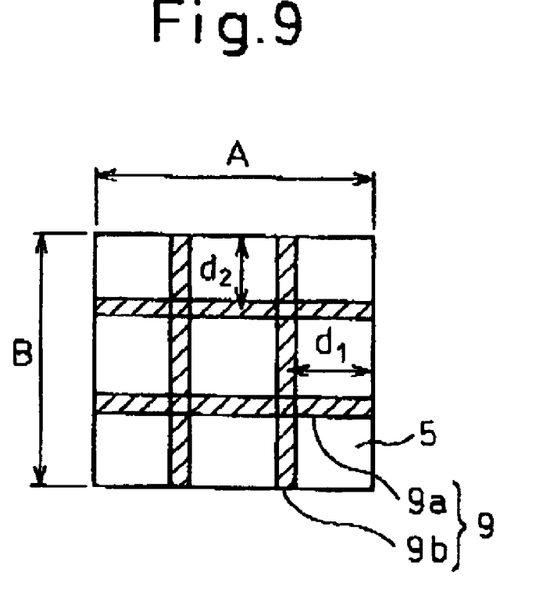
FIG. 9 is a schematic plan view showing an example of the positions of projecting shapes which have been provided in the cross-type arrangement in the present invention.
Figure 10:
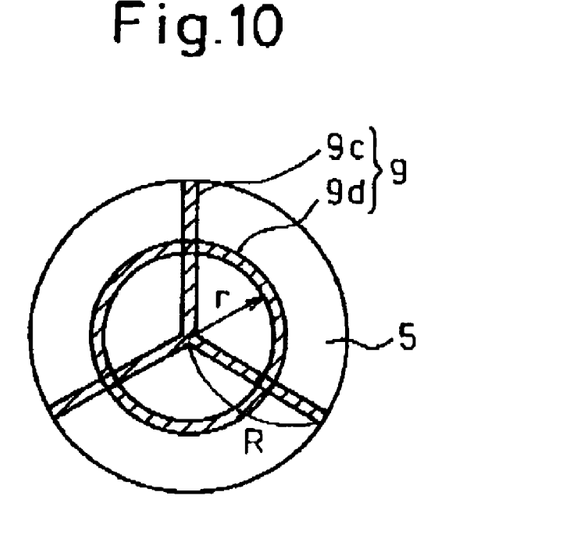
FIG. 10 is a schematic plan view showing another example of the positions of projecting shapes which have been provided in the cross-type arrangement in the present invention.

FIG. 9 and FIG. 10 are schematic plan views each showing an example of the arrangement of the cross-type projecting shape. Referring to FIG. 9, in this embodiment, when the size of the entire dielectric material 5 in the transverse direction is represented by "A", and the size of the entire dielectric material 5 in the longitudinal direction is represented by "B", the interval d1 between the projecting shapes 9 in the transverse direction may preferably be ½A or less. In other words, it is preferred that two or more projecting shapes 9 are present in this transverse direction. On the other hand, the interval d2 between the projecting shapes 9 in the longitudinal direction may preferably be ½B or less. In other words, it is preferred that two or more projecting shapes 9 are present in this longitudinal direction.

Referring to FIG. 10, in this embodiment, when the radius of the entire dielectric material 5 is represented by "R", it is preferred that at least one ring-shaped projecting shape 9d is present. The position of the ring 9d may preferably be such that the ring 9d is positioned at a point which is nearer to the wall surface side of the chamber 3, with respect to the intermediate position of chamber 3 in the chamber radius R. In other words, when the radius of the ring 9d is represented by "r", it is preferred that a relationship of r≧½×R is satisfied. On the other hand, three or more projecting shapes 9c may preferably be present in the radial direction. The projecting shapes 9c may preferably be present so that the intervals therebetween are almost equal to each other.

(Interconnection of Projecting Shapes)

FIG. 1A is a schematic plan view showing an example of the embodiment wherein projecting shapes 9 are mutually connected to each other, as desired; FIG. 11B is a schematic plan view showing a section of FIG. 11A along the line A—A; and FIG. 11C is a schematic plan view showing a section of FIG. 11A along the line B—B.

Figure 11A:
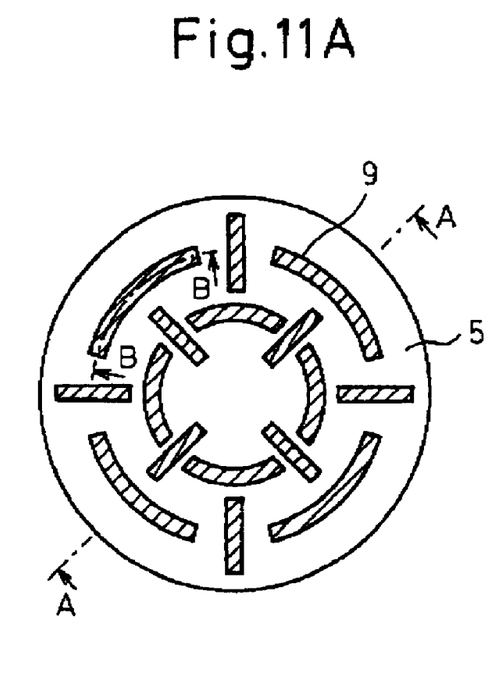
FIG. 11A is a schematic plan view showing an example of the embodiment of the plasma processing apparatus according to the present invention wherein projecting shapes are mutually connected.
Figure 11B:
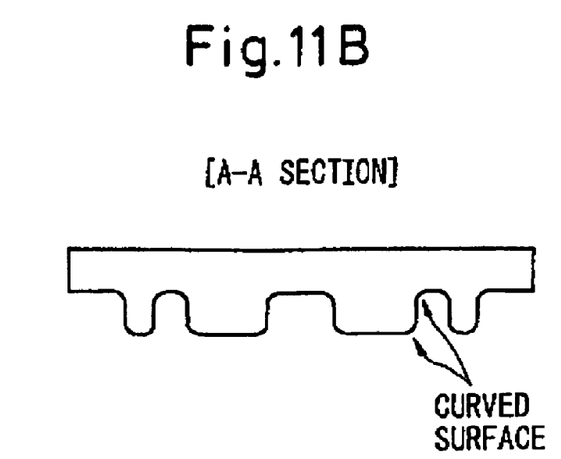
FIG. 11B is a schematic sectional view showing the section of the projecting shape along the line A—A.
Figure 11C:
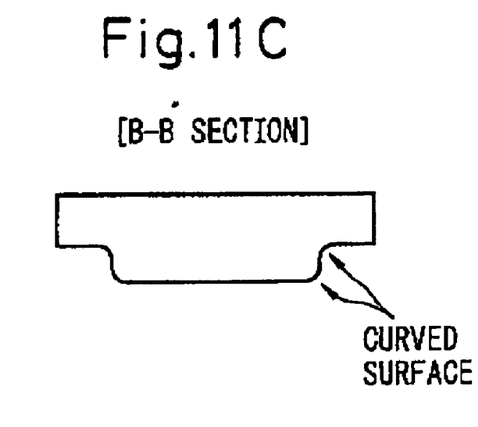
FIG. 11C is a schematic sectional view showing the section of the projecting shape along the line B—B.

As shown in the above FIGS. 11A–11C, in a case where cross-type shaped projecting shapes 9 are provided in-plane, when no gas having a film-forming property is used, these projecting shapes 9 constituting the cross-type arrangement may be mutually connected to each other. In addition, when no gas having a film-forming property is used, the curved surfaces as shown in FIGS. 11B and 11C are omissible.

Hereinabove, preferred embodiments of the present invention have been described, but these embodiments can be modified and changed within the spirit of the present invention. For example, the plasma processing apparatus 100 of the present invention does not exclude the utilization of electron cyclotron resonance and, therefore, the plasma processing apparatus may also have a coil for generating an predetermined magnetic field. In addition, while the microwave plasma processing apparatus 100 has been described as a plasma processing apparatus, it is of course possible that such a microwave plasma processing apparatus may also be used when a semiconductor wafer W is etched or cleaned. Further, the object 2 to be processed in the present invention is not limited to a semiconductor wafer, but includes a base material or substrate for an LCD (liquid crystal device).

As described hereinabove, the present invention provides a plasma processing apparatus which can suppress the production of dust, particles, etc., while suppressing surface wave plasma which is harmful to the plasma processing procedure.

From the invention thus described, it will be obvious that the invention may be varied in many ways. Such variations is not to be regarded as a departure from the spirit and scope of the invention, and all such modifications, as would be obvious to one skilled in the art, are intended to be included within the scope of the following claims.

What is claimed is:

1. A plasma processing apparatus, comprising:
   a plasma processing chamber for processing therein an object to be processed;
   antenna means for guiding microwaves into the plasma processing chamber; and
   a dielectric member disposed between the antenna means and the plasma processing chamber;
   wherein a surface of the dielectric member facing the inside of the plasma processing chamber has a projection provided in a circumferential direction of the dielectric member, and
   wherein the projection has a corner-shaped or edge shaped portion having a curved surface.

2. A plasma processing apparatus according to claim 1, wherein the antenna means comprises a plane antenna member having plural slots.

3. A plasma processing apparatus according to claim 1, wherein the dielectric member also has a projection provided in a radial direction thereof.

4. A plasma processing apparatus, comprising:
   a plasma processing chamber for processing therein an object to be processed;
   antenna means for guiding microwaves into the plasma processing chamber; and
   a dielectric member disposed between the antenna means and the plasma processing chamber;
   wherein a surface of the dielectric member facing an inside of the plasma processing chamber has a projection provided along longitudinal and transverse directions of the dielectric member.

5. A plasma processing apparatus according to claim 4, wherein the antenna means comprises a plane antenna member having plural slots.

6. A plasma processing apparatus according to claim 4, wherein the projection has a corner-shaped or edge-shaped portion having a curved surface.

7. A plasma processing apparatus according to claim 4, wherein the dielectric member has a plurality of projections facing the inside of the plasma processing chamber, the projections are provided so that they constitute a crossing-type arrangement, and a crossing portion of the projections has a curved surface.

8. A plasma processing apparatus according to claim 4, wherein the dielectric member has a plurality of projections facing the inside of the plasma processing chamber, and crossing of the projections is avoided.

* * * * *